United States Patent [19]

de Klerk

[11] 4,259,649
[45] Mar. 31, 1981

[54] ELECTROACOUSTIC DELAY LINE APPARATUS

[75] Inventor: John de Klerk, Pittsburgh, Pa.

[73] Assignee: Westinghouse Electric Corp., Pittsburgh, Pa.

[21] Appl. No.: 61,100

[22] Filed: Jul. 26, 1979

[51] Int. Cl.³ .................. H03H 9/40; H03H 9/38; H03H 9/13
[52] U.S. Cl. .................. 333/144; 333/147; 333/149; 333/188
[58] Field of Search .................. 333/150-155, 333/193-196, 141, 142, 143, 149, 186-189, 144; 331/107 A; 364/821; 310/320-323, 334, 365, 366

[56] References Cited

U.S. PATENT DOCUMENTS

| | | | |
|---|---|---|---|
| 3,300,739 | 1/1967 | Mortley | 333/141 |
| 3,343,105 | 9/1967 | Van Der Pauw | 310/313 X |
| 3,387,233 | 6/1968 | Parker, Jr. | 333/149 |
| 3,401,360 | 9/1968 | Schulz-du Bois | 310/313 X |
| 3,573,669 | 4/1971 | Papadakis | 310/334 |
| 3,611,203 | 10/1971 | Cooper | 333/154 |
| 3,621,309 | 11/1971 | Yokoyama et al. | 333/186 X |
| 3,675,052 | 7/1972 | Lindsay et al. | 333/142 X |
| 3,689,784 | 9/1972 | de Klerk | 333/154 X |
| 3,769,615 | 10/1973 | de Klerk | 333/149 |
| 3,825,779 | 7/1974 | de Klerk | 333/195 X |
| 3,836,876 | 9/1974 | Marshall et al. | 333/195 X |
| 3,846,722 | 11/1974 | de Klerk | 333/193 |
| 4,055,820 | 10/1977 | Solie | 333/153 |
| 4,117,424 | 9/1978 | Coldren et al. | 333/152 |

OTHER PUBLICATIONS

Coquin et al.-"Theory and Performance of Perpendicular Diffraction Delay Lines", Proceedings of the IEEE, Jun. 1965, pp. 581-591.

Yen et al.-Efficient Bulk Wave Excitation of Quarts, Electronics Letters Jan. 20, 1977, vol. 13, No. 2, pp. 37-38.

Primary Examiner—Marvin L. Nussbaum
Attorney, Agent, or Firm—R. G. Brodahl

[57] ABSTRACT

An electroacoustic apparatus is disclosed for providing beam steered and focused compressional or shear waves, using an interdigital generating grid operative with one surface of a piezoelectric delay line member. The generating transducer is provided with electrode elements having a variable spacing determined by the location of a receiving transducer on another surface of the delay line. The electrode elements are energized in a predetermined phase relationship by an input signal. The apparatus is suitable for use to process signals as a pulse compression or pulse expansion dispersive delay line.

6 Claims, 12 Drawing Figures

|  | | $\varepsilon_1$ | $\varepsilon_2$ | $\varepsilon_3$ | $\varepsilon_4$ | $\varepsilon_5$ | $\varepsilon_6$ |
|---|---|---|---|---|---|---|---|
|  | | $\sigma_1$ | $\sigma_2$ | $\sigma_3$ | $\sigma_4$ | $\sigma_5$ | $\sigma_6$ |
| $E_1$ | $P_1$ | ∘ | ∘ | ∘ | ∘ | $d_{15}$ | $d_{16}$ |
| $E_2$ | $P_2$ | $d_{21}$ | $d_{22}$ | ∘ | $d_{24}$ | ∘ | ∘ |
| $E_3$ | $P_3$ | $d_{31}$ | $d_{32}$ | $d_{33}$ | ∘ | ∘ | ∘ |

ELECTROACOUSTIC DELAY LINE APPARATUS

GOVERNMENT CONTRACT

The Government has rights in this invention pursuant to Contract No. F33615-76-C-1337 awarded by the Department of the Air Force.

CROSS REFERENCE TO RELATED APPLICATIONS

The invention covered by this patent application is related to the invention covered by a concurrently filed patent application Ser. No. 061,089 filed July 26, 1979 by R. W. Weinert et al. and entitled "Electroacoustic Delay Line Apparatus", and which is assigned to the same assignee; the disclosure of that related patent application is incorporated herein by reference.

BACKGROUND OF THE INVENTION

This invention relates to electroacoustic transducer apparatus and more particularly to bulk mode acoustic delay line devices.

In the prior art it was known as disclosed in U.S Pat. No. 3,401,360 to provde an acoustic wave transducer having interdigital electrode elements comprising two interlaced arrays on one surface of a piezoelectric member, with provided spacing so that adjacent electrodes of the respective arrays are separated by one-quarter wavelength or odd multiples thereof. The two arrays are driven by an input signal with respect to a common electrode located on the opposite surface of the piezoelectric member and in phases displaced from each other by 90° or odd multiples thereof. In effect each electrode element in an individual bulk wave transducer and each is phased differently than the adjacent electrode elements to provide the desired minimization of the higher order energy lobes and selected energy lobes.

SUMMARY OF THE INVENTION

In accordance with the present invention, electroacoustic apparatus is provided including an interdigital grid generating transducer located on and coupled to one end surface of a delay line having piezoelectric properties and which uses those properties of the delay line for the generation of desired bulk acoustic waves in the delay line. The electrode elements of the generating transducer are provided with a variable spacing in accordance with the location of the receiving transducer positioned on another surface of the delay line.

DESCRIPTION OF THE PREFERRED EMBODIMENT

Figure 1:
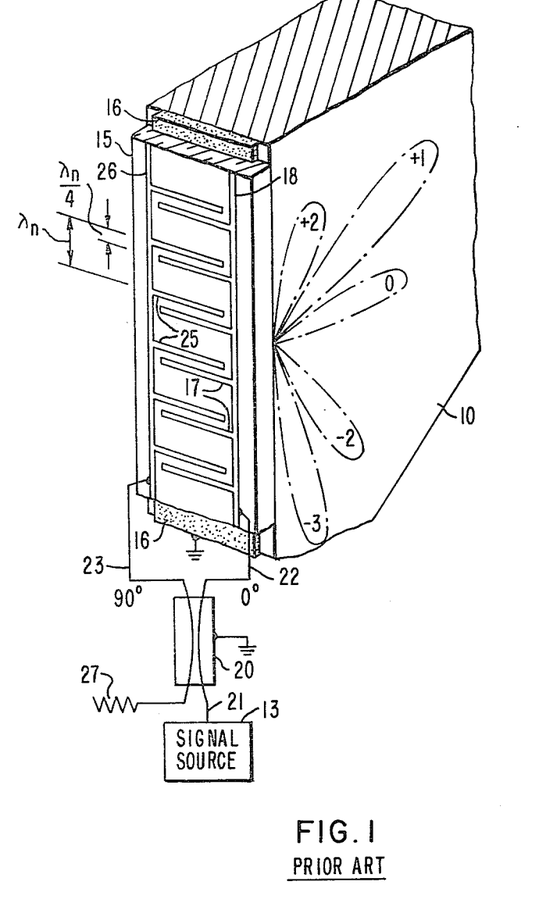
FIG. 1 shows a prior art acoustic wave apparatus.

In FIG. 1 there is shown a prior art transducer apparatus as disclosed in U.S. Pat. No. 3,401,360. An interdigital input transducer is provided having electrode elements 17 of a first array interleaved between electrode elements 25 of a second array and spaced one-quarter wavelength or an odd multiple thereof away from each electrode 17 of the first array. The electrode elements 17 are commonly tied together and energized by a zero phase input signal and the electrode elements 25 are commonly tied together and energized by a 90° out of phase input signal. The end surface 11 and the top surface 12 of the ultrasonic propagation material delay line 10 are at right angles to each other.

Figure 2:
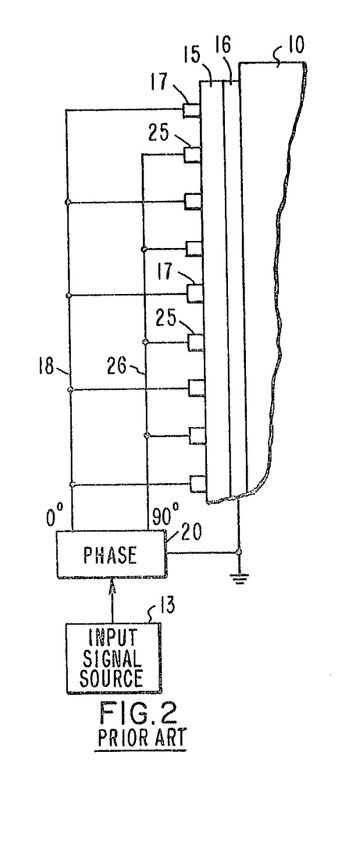
FIG. 2 shows the input signal relationships for the generating transducer of FIG. 1.

In FIG. 2 there is shown the input signal source 13 connected through the phase device 20 to energize with a zero degree signal the first array of electrode elements 17 through the conductive rail 18 and to energize with a 90° out of phase signal the second array of electrode elements 25 through conductive rail 26.

Figure 3:
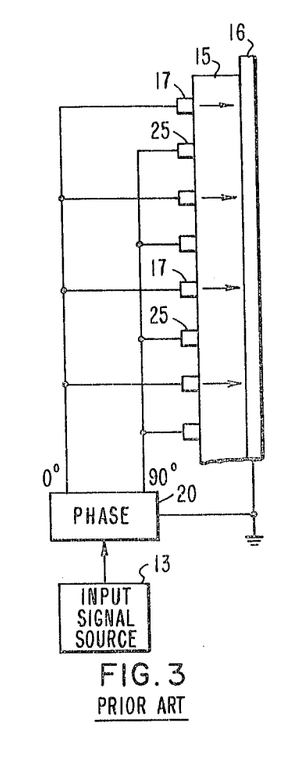
FIG. 3 shows the resulting electric fields in the piezoelectric member of the generating transducer of FIG. 1.

FIG. 3 shows the resulting electric fields provided through the piezoelectric member 15 with the electric field provided by the electrode elements 17 being out of phase in relation to the electric fields provided by the electrode elements 25.

Figure 4:
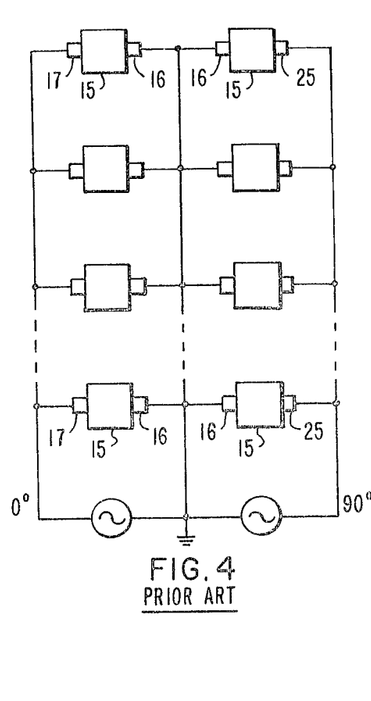
FIG. 4 shows the electrical parallel circuit arrangement of the electrode elements of FIG. 1.

FIG. 4 shows the electrically parallel connections of the electrode element 17 in comparison with the electrically parallel connections of the electrode elements 25. If 50 ohms of input impedance is desired for coupling with the input signal source, it is difficult to achieve this input impedance for particularly the higher frequency input signals due to the parallel circuit connections of the respective electrode elements.

Figure 5:
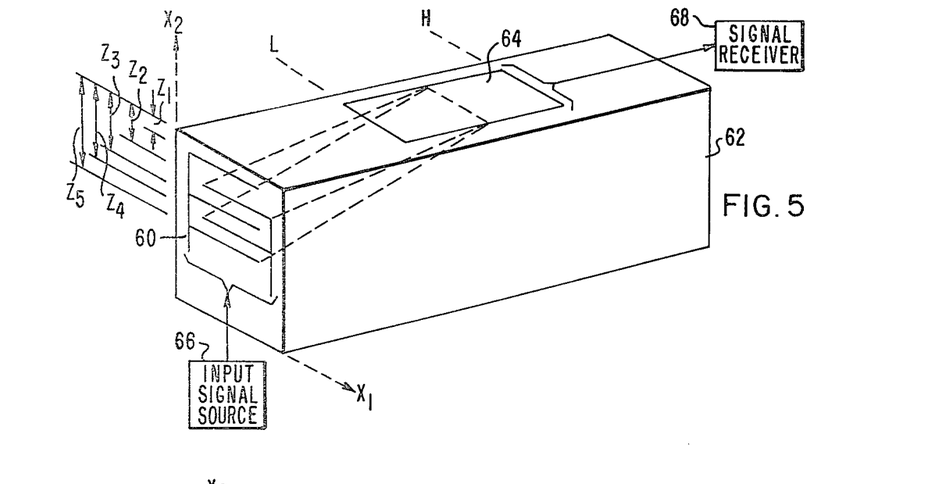
FIG. 5 shows the acoustic wave apparatus of the present invention.

FIG. 5 shows the acoustic wave transducer apparatus of the present invention including a Zno bulk wave interdigital generating input transducer 60 which is energized in a phase relationship for the electrode elements of $0,\rho,0,\rho$ and so forth and coupled with a piezoelectric delay line made of LiNbO$_3$ material. The generating transducer 60 is provided with electrode elements having a variable spacing to focus the generated acoustic wave energy in relation to the location of the receiving transducer 64 positioned on another surface of the delay line 62. The sensor receiving output transducer 64 is coupled with the $X_1X_3$ surface of the delay line 62 and is positioned in relation to the input transducer such that the lower frequency component of the signal applied to input transducer 60 by the input signal source 66 will be focused at location L on the output transducer 64 and the higher frequency component of the signal applied to input transducer 60 by the input signal source 66 will be focused at location H on the output transducer 64. The output signal from the transducer 64 is supplied to a signal receiver 68.

Figure 6:
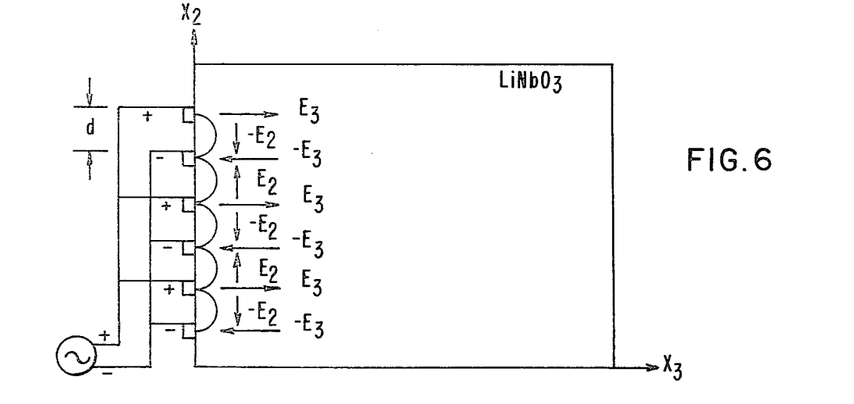
FIG. 6 shows the electric fields generated inside the piezoelectric delay line material.

FIG. 6 shows the electric fields generated within the delay line 62 by the input transducer 60.

Figure 7:
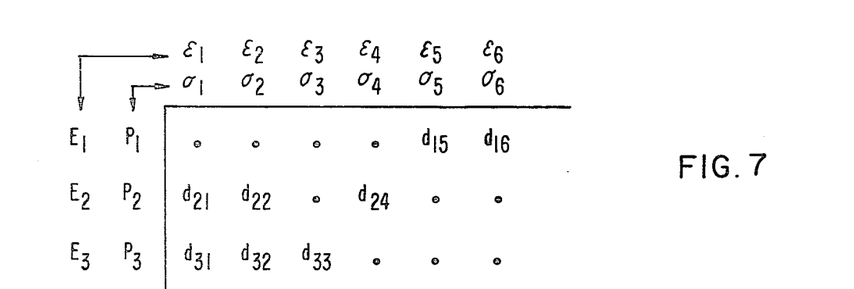
FIG. 7 illustrates the piezoelectric matrix for the delay line material.

FIG. 7 shows the piezoelectric matrix for the LiNbO$_3$ material of the delayed line 62. Using this piezoelectric matrix shown in FIG. 7 and the electric fields as shown in FIG. 6 and indicated along the X$_2$ and X$_3$ axes the following strains are generated.

$$\begin{aligned}\epsilon_1 &= d_{21}E_2 & \epsilon_1 &= d_{31}E_3 \\ \epsilon_2 &= d_{22}E_2 \text{ as well as } & \epsilon_2 &= d_{32}E_3 \\ \text{and } \epsilon_4 &= d_{24}E_2 & \epsilon_3 &= d_{33}E_3 \end{aligned} \quad (1)$$

Now $\epsilon_1$ is a compressional strain with particle displacement and energy flow along the X$_1$ axis; $\epsilon_2$ is a compressional strain with particle displacement and energy flow along the X$_2$ axis; $\epsilon_3$ is a compressional strain with particle displacement and energy flow along the X$_3$ axis; while $\epsilon_4$ is a shear which shears about the X$_1$ axis and can have either displacement, along X$_2$ and energy flow along X$_3$, or displacement along X$_3$ and energy flow along X$_2$. Where such an interdigital grid transducer 60 is used to generate surface or Rayleigh waves, $\epsilon_3$ and $\epsilon_4$ combine to produce a retrograde elliptical particle motion with energy flow along X$_2$. This type of coupling occurs when the spacing d (shown in FIG. 6) is near $\lambda/2$, where $\lambda$ is the wavelength of the surface wave. In this case the surface wave propagates on the X$_1$X$_2$ surface on which the input transducer 60 is coupled and in the X$_2$ direction.

Figure 8:
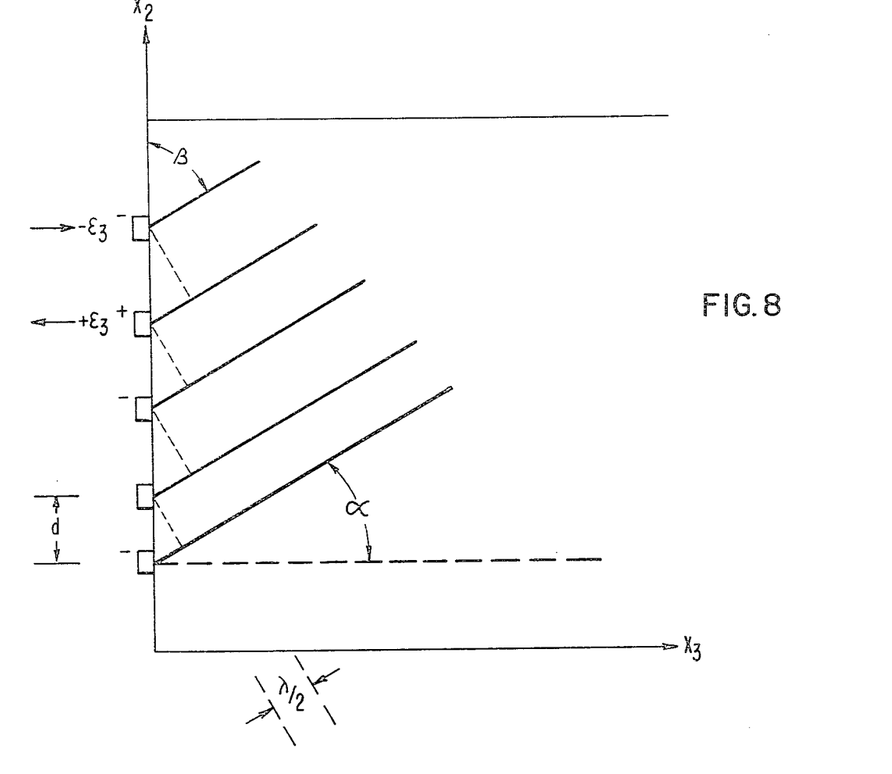
FIG. 8 shows the constructive interference taking place at an angle $\beta$ within the delay line material.

The interdigital grid 60 also behaves like two interleaved diffraction gratings which are 180° out of phase with one another, the energy being supplied by the $\epsilon_3$'s. Since adjacent energy sources are out of phase, no energy flow along the X$_3$ axis as the main lobes will cancel each other. However, at some angle $\alpha$, shown in FIG. 8, constructive interference will occur, i.e., when there is $\lambda/2$ path length different between the rays from adjacent sources. This occurs when $$\sin \alpha = V/(2df), \quad (2)$$

where
V = acoustic velocity
f = input signal frequency.

From Equation 2 it is clear that if d is kept fixed, then $\alpha$ varies with frequency and is inversely proportional to frequency. Hence, by varying frequency, the energy leaving the interdigital grid transducer 60 can be steered in any desired direction. In addition, at any given frequency f, if d is varied the values of $\alpha$ can be varied. By selecting suitable values of d it is then possible, at a given frequency, to focus the beam to a line. By correctly locating the interdigital grid transducer 60 on the X$_1$X$_2$ surface of FIG. 5, the focused line can be placed at the desired position on the X$_1$X$_3$ sensor transducer 64 for that chosen frequency. Hence, by choosing suitable values of d, i.e., varying the spacing between the grid fingers of transducer 60 and varying the input signal frequency, the beam of bulk waves generated by the grid transducer 60 can be steered and focused to any desired location of the surface sensor transducer 64.

By considering the strains, $\epsilon_3$ and $\epsilon_4$ of the surface wave, it will be seen that when $\lambda/2$ becomes shorter than d, the surface wave energy becomes "leaky", i.e., the energy no longer remains tied to the surface of the X$_1$X$_2$ plane. When $\lambda/2$ for the shear component becomes much shorter than d, the two strains become uncoupled and propagate into the bulk with their own characteristic velocities. For the $\epsilon_2$ and $\epsilon_4$ strains, construction interference will occur at an angle $\beta$ (shown in FIG. 8) when $$\cos \beta = (V/2df). \quad (3)$$

Since the bulk velocities V$_s$ (shear) and V$_c$ (compressional) are markedly different (V$_c \simeq 2$V$_s$) it will be seen from Equation (3) that the angle $\delta$ will be much larger for shear waves than for compressional waves. This characteristic is of great value in designing compressive or dispersive delay lines, as the shear and compressional beams are well separated and either or both beams can be used to perform the desired function.

Using Equation (2) to calculate the angle $\alpha$ of FIG. 8 for 1 GHz compressional waves ($\epsilon_3$ strains) when d = $10^{-3}$ cm, and V = $7.306 \times 10^5$ cm/sec, $$\begin{aligned}\sin \alpha &= \frac{7.306 \times 10^5 \text{ cm/sec}}{2 \times 10^{-3} \times 10^9 \text{ cm/sec}} \\ &= 0.3653 \\ \alpha &= 21.4°.\end{aligned} \quad (4)$$

This would be the direction of the compressional beam generated by the E$_3$ field shown in FIG. 6.

Now, using Equation (3) to determine the angle $\beta$ of FIG. 8 due to the strains $\epsilon_2$ and fields E$_2$ at the same frequency, $$\begin{aligned}\cos \beta &= \frac{7.306}{2 \times 10^{-3} \times 10^9} \\ &= 0.3653 \\ \therefore \beta &= 68.6°.\end{aligned} \quad (5)$$

Hence, $\alpha$ and $\beta$ are complementary angles, i.e., the energy from both $\epsilon_2$ and $\epsilon_3$ will propagate in the same direction resulting in constructive interference. By changing the spacing, d, between fingers of the transducer 60, as described in greater detail in the above-reference patent application Ser. No. 061,089, filed July 26, 1979, the energy from all fingers of the transducer 60 can be focused to a line on the upper surface of the dispersive delay line shown in FIG. 5.

By applying a "down" chirp (frequency-modulated) signal to the input grid transducer 60 on the X$_1$X$_2$ face in FIG. 5, all the energy will arrive at the sensor grid 64 simultaneously, thus generating a compressed pulse. By changing the input signal to an "up" chirp impulse, the output signal would expand into an up chirp FM. Hence, the device can be used as a pulse compressor or a pulse expander.

Figure 9:
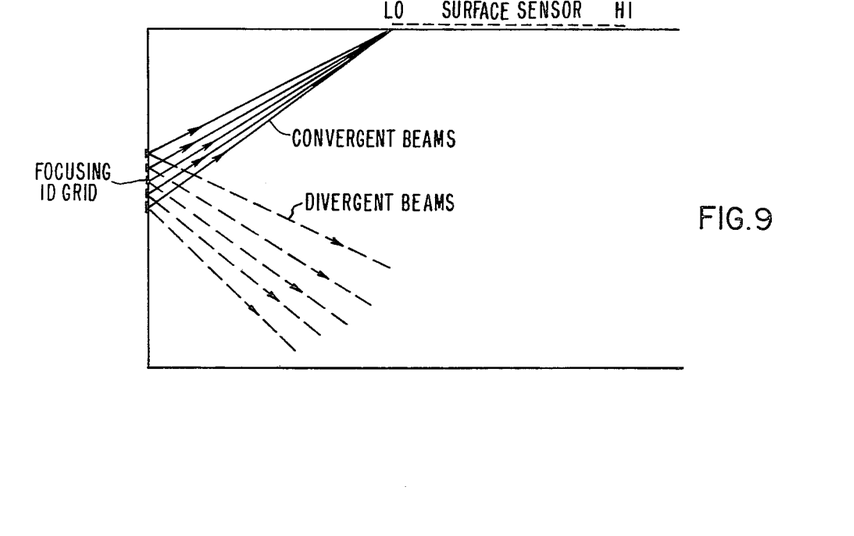
FIG. 9 shows how the acoustic energy beams provided by the generating transducer will propagate for a focusing interdigital grid.

FIG. 9 shows how the beams generated by the transducer 50 will propagate for a focusing interdigital grid 60. The upper set of beams will be convergent and will converge to a line at the surface sensor 64 provided the focusing grid 60 has been correctly located on the end X$_1$X$_2$ surface of the delay line 62, which can readily be determined. The lower and unused beam will be divergent and can be prevented from returning to the interdigital surface sensor 64 by tilting the lower X$_1$X$_3$ surface of the delay line to thus avoid reception of any spurious signals.

It was mentioned earlier that shear strains $\epsilon_4$ would also be generated by an electrical signal applied to the grid 64. Using Equation (3) and assuming the velocity of shear waves to be $3.58 \times 10^5$ cm/sec, $\beta$ for 1 GHz would be $$\cos \beta = \frac{3.58 \times 10^5}{2 \times 10^{-3} \times 10^9} = 0.1725 \quad (6)$$
$$\therefore \beta = 79.6°.$$

Thus, the compressional and shear beams are separated by 11.0° at 1 GHz. It can also be shown that the swept compressional and shear beams do not overlap even for a bandwidth from 1 to 2 GHz.

The angle $\beta$ for compressional waves at 2 GHz is computed to be 79.4° which is 0.2° away from the shear beam at 1 GHz.

The surface sensor conversion efficiency for the compressional wave due to $\epsilon_2$ and $\epsilon_3$ generated simultaneously can be estimated as follows:

$$P_2 = d_{22}\sigma_2 \text{ and } P_3 = d_{33}\sigma_3. \quad (7)$$

Since the stress wave impinges on the surface sensor 64 at an angle of 21.4°, the $P_2$ component will be proportional to sin 21.4°, while the $P_3$ component will be proportional to cos 21.4°. Using the electromechanical coupling coefficients $k_{22}$ and $k_{33}$, the conversion efficiency becomes $$(k_{22}^2 - k_{22}^4) \sin 21.4° + (k_{33}^2 - k_{33}^4) \cos 21.4°. \quad (8)$$

Calculated values of $(k_{22}^2 - k_{22}^4) = 0.093$ and $(k_{33}^2 - k_{33}^4) = 0.02601$. Hence, total conversion is $$\begin{aligned} 0.093 \sin 21.4 &+ 0.02601 \cos 21.4 \\ &= 0.0339 + 0.0242 \\ &= 0.0581. \end{aligned} \quad (9)$$

Hence, the conversion loss due to $\epsilon_2$ and $\epsilon_3$ is $-12.36$ dB, whereas the conversion loss at 21.4° due to $\epsilon_3$ alone, which would be generated by a ZnO mosaic, would be $-17.02$ dB.

Figure 10:
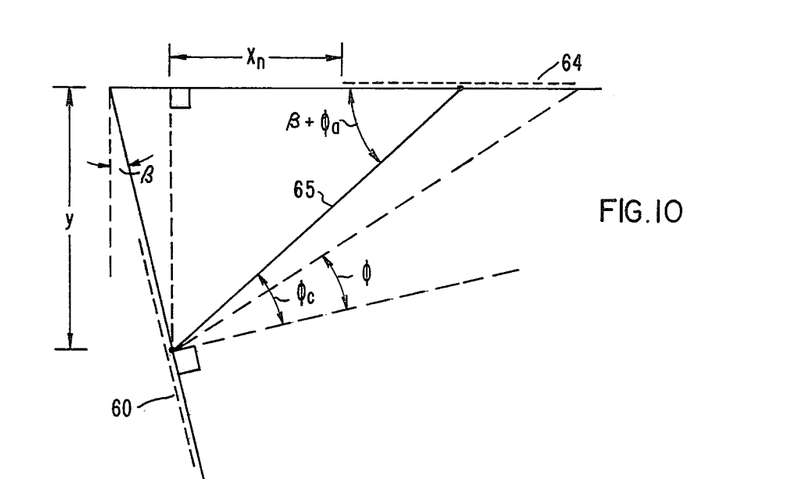
FIG. 10 shows the sensing transducer positioning variables relative to the input transducer on the end of the delay line.

As shown in FIG. 10, the surface sensing transducer 64 is located in a plane on the LiNbO$_3$ rod, which is nearly at a right angle with respect to the bulk wave launching or generating mosaic transducer 60. It can be composed of an array of aluminum or gold interdigital finger pairs, each being capable of sensing the bulk wave interaction with the surface. The design requirements of the sensing array 64, in relation to finger placement and pair resonant frequency, are dependent on the frequency response characteristics of the bulk wave beam. Both sensing transducer 64 and mosaic transducer 60 must together generate the required linear FM waveform. The response characteristics of the beam, with respect to the surface sensing plane, are highly dependent upon material propagation characteristics, realizable substrate geometrics and steering characteristics of the mosaic transducer 60. Neglecting material beam steering effects, and considering only the mosaic launching characteristics, give the following expression for beam propagation direction.

$$\phi = V/(2fd) \quad (10)$$

V = Bulk wave velocity, cm/μsec
d = mosaic 0, $\rho$ repeat interval, cm
f = frequency, MHz
$\phi$ = deviation in radians of launched beam above normal from mosaic, (wave normal direction).

For the lowest frequency of interest of the input signal, the beam intercepts the surface at the smallest length to dimension Xn of FIG. 10. The surface sensing fingers placed in this region would then be resonant at this frequency having a center-to-center spacing of one half wavelength. At the high frequency end of the bandpass spectra, the angle $\phi$ would be smaller and the dimension Xn larger. As a first order approximation, then the spacing between fingers would decrease monotonically as the frequency and Xn increased. Inclusion of beam steering, due to propagation off of the pure mode axis, would modify $\phi$ as given by the following expression:

$$\phi_a = \phi - (\phi - \phi_c) \text{Sl} \quad (11)$$

$\phi_c$ = angle from normal to pure mode axis (c crystal axis).
$\phi_a$ = power flow direction
Sl = linear slope approximation. Degrees of deviation of power flow axis from wave normal per degree of wave normal deviation from pure mode axis.

The geometry of the LiNbO$_c$ rod is adjusted with an off set of $\beta$ degrees from normal between the plane of the sensing transducer 64 and the plane of generating mosaic transducer 60 so that the band center (1500 MHz) would lie along the pure mode c-axis 65. This allows for nearly symmetrical beam steering effects for those frequencies about the band center. Considering the geometry and beam steering effects, the transit length from mosaic 60 center to beam intercept center on the transducer 64 is given by the following expression.

$$\text{lp} = y \csc(\phi_a + \beta) \quad (12)$$

y = distance along normal from sensing plane to mosaic center.

The delay time from mosaic 60 to the surface sensor 64 is given by, $$\text{Tp} = (\text{lp})/(\text{Vg}) \quad (13)$$

Vg = group velocity = Vp SEC($\phi - \phi_c$)Sl)
Vp = phase velocity c-axis.

Table 1 below lists the path length lp, delay time Tp and change in delay $\Delta$Tp as a function of frequency across the 1.0 to 2.0 GHz band for the case of an isotropic (non-beam steering) material. Table 1 calculations are based on an initially calculated phase velocity of 0.73338 cm per μsec. Table 2 indicates the effect of beam steering on path length for the anisotropic (beam steering) case. Here, the beam steering slope Sl, as previously defined, was initially estimated as 0.1288 deg/deg. The distance y and angle $\beta$ determine the region of intercept on the sensing surface.

y = 0.4154 cm
$\beta$ = 4.6 degrees.

TABLE 1

PATH LENGTHS OF BEAM CENTER FROM MOSAIC TO SENSING SURFACE.
ISOTROPIC CASE, VP = 0.73338 CM/μSEC.

| Frequency MHz | Path Length ln, cm. | Delay Time Tp μsec | ΔTp μsec |
|---|---|---|---|
| 1000 | 3.2721 cm | 4.4616 | 0 |
| 1100 | 3.3851 | 4.6158 | .1542 |
| 1200 | 3.4856 | 4.7527 | .1369 |
| 1300 | 3.5753 | 4.8751 | .1224 |
| 1400 | 3.6561 | 4.9852 | .1101 |
| 1500 | 3.7291 | 5.0848 | .0996 |
| 1600 | 3.7954 | 5.1752 | .0904 |
| 1700 | 3.8560 | 5.2578 | .0826 |
| 1800 | 3.9114 | 5.3334 | .0756 |
| 1900 | 3.9624 | 5.4029 | .0695 |
| 2000 | 4.0095 | 5.4671 | .0642 |

TABLE 2

PATH LENGTHS OF BEAM CENTER FROM MOSAIC TO SENSING SURFACE. ANISOTROPIC CASE, VP = 0.7338 CM/μSEC, SI = 0.1288 DEG/DEG.

| Frequency MHz | Path Length ln, cm. | Delay Time Tp μsec | ΔTp μsec |
|---|---|---|---|
| 1000 | 3.3245 cm | 4.5331 | 0 |
| 1100 | 3.4258 | 4.6713 | .1382 |
| 1200 | 3.5151 | 4.7930 | .1217 |
| 1300 | 3.5944 | 4.9012 | .1082 |
| 1400 | 3.6653 | 4.9978 | .0966 |
| 1500 | 3.7291 | 5.0848 | .0870 |
| 1600 | 3.7867 | 5.1634 | .0786 |
| 1700 | 3.8391 | 5.2348 | .0714 |
| 1800 | 3.8869 | 5.3000 | .0652 |
| 1900 | 3.9307 | 5.3597 | .0597 |
| 2000 | 3.9710 | 5.4147 | .0550 |

Figure 11:
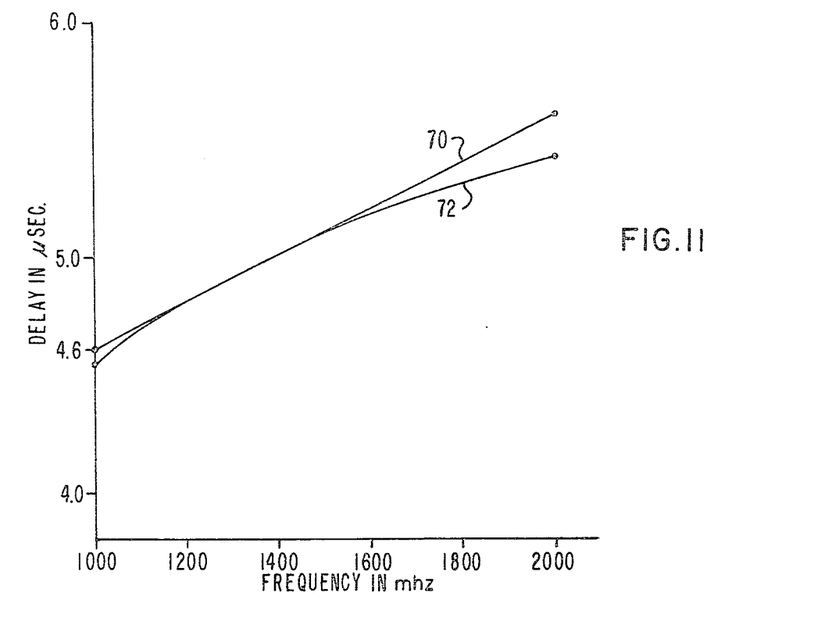
FIG. 11 illustrates the acoustic beam center delay characteristic in relation to the sensing transducer surface.

FIG. 11 shows a plot of anisotropic case of Table 2 along with an ideal linear FM delay characteristic. The ideal linear FM curve 70 has a slope of 1 μsec per 1 GHz and is drawn in FIG. 11 so as to intercept the beam center delay curve 72. The delay characteristic is quite nonlinear and needs considerable correction. The deviation at the 1.0 GHz spectrum end is $-0.07$ μsec and at the 2.0 GHz end is $-0.18$ μsec. In the following discussion, the method of linearization is presented.

Figure 12:
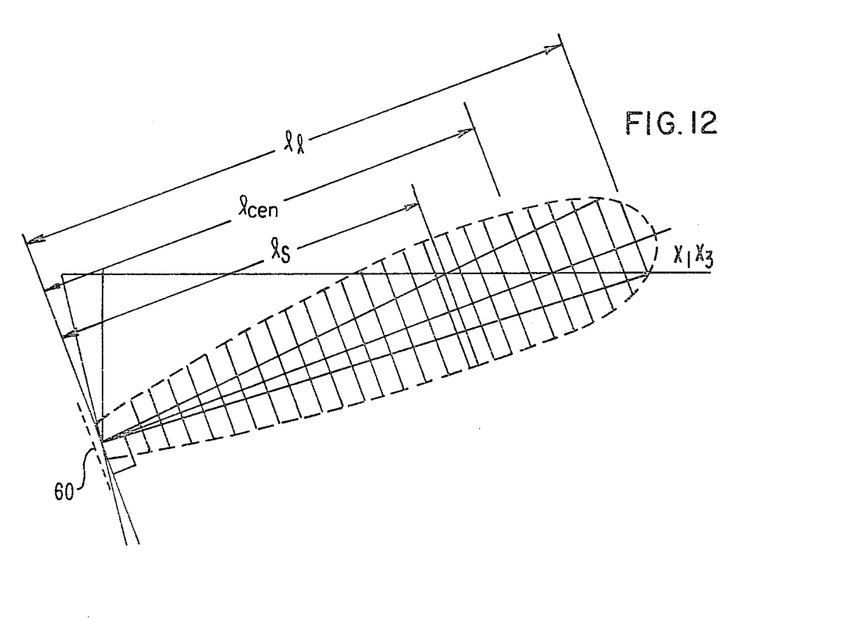
FIG. 12 illustrates the electrode element positioning interval in relation to a hypothetical acoustic energy beam shape.

The method of linearization used involves taking advantage of the relatively wide unfocused bulkwave 3 dB beam width shown in FIG. 12, and correspondingly long intercept distance on the sensing surface. If fingers resonant at the frequency of the beam are placed on the sensing surface at the beam intercept center, the nonlinear delay characteristic of FIG. 11 would be obtained. If these same fingers were moved to new positions within the 3 dB beam width, the frequency versus delay characteristics could be forced to approach the ideal linear case.

FIG. 12 shows the beam and wave front as it intercepts the $X_1X_3$ surface of the delay line. An approximated beam shape and normal wave front of propagation are assumed. If fingers resonant at this frequency, are placed at the shortest distance from the generating mosaic transducer 60 within the 3 dB beam width, a path length of ls will be traversed. The delay time to ls is shorter than the delay time to lc, the beam center. Similarly, the delay time to the upper 3 dB beam position $l_l$ is longer than to lc. As such, a basis for delay adjustment has been established.

The bulk wave transducer apparatus here disclosed is described in additional detail in a report AFAL-TR-78-19, Volume II, entitled "Acoustic Wave Compressive Delay Line", published in November 1978 by the U.S. Air Force Avionics Laboratory, the disclosure of which is incorporated herein by reference.

It has been shown that a focusing input interdigital grid transducer 60 coupled with the end of a delay line made of $LiNbO_3$ material having piezoelectric properties can be used to steer and focus both compressional and shear waves to provide a wide band dispersive delay line, with input signal pulse compression and pulse expansion performed using standard photolithographic techniques. The delay line material is not limited to the use of $LiNbO_3$ but can also be all crystals of class 3 and all materials of class 6 mm and 4 mm, which includes most piezoelectric materials in microwave acoustic devices.

I claim:
1. In electroacoustic apparatus for delaying an input signal having a known bandwidth of frequencies, the combination of
   a delay line made of piezoelectric material having a beam steering pure mode axis and having a first surface and a second surface,
   a first transducer responsive to the input signal and including a plurality of electrode elements arranged in a plurality of arrays of interleaved interdigital grids of electrode elements coupled with the first surface of the delay line for generating acoustic wave energy within the delay line and directed along said beam steering axis toward the second surface,
   a second transducer positioned on the second surface for receiving the generated acoustic wave energy from the first surface,
   with the spacing between the respective electrode elements of each said array of the first transducer having a predetermined relationship to said known bandwidth of frequencies of the input signal to focus the generated acoustic wave energy in relation to said beam steering axis and on the second transducer at a predetermined portion of the second transducer in relation to the respective frequencies of the input signal.

2. The electroacoustic apparatus of claim 1, with each array of electrode elements of the first transducer being operative with said first surface of the delay line such that the acoustic wave energy is generated within the delay line and in relation to said axis using the piezoelectric properties of the delay line material.

3. The electroacoustic apparatus of claim 1, with the spacing of the electrode elements of each said array having a predetermined variation to focus the generated acoustic wave energy from the first transducer onto the second transducer in relation to said beam steering axis for each frequency of the input signal.

4. The electroacoustic apparatus of claim 1 operative with an input signal pulse, with the second transducer providing an output signal comprising a selected one of a compressed pulse or an expanded pulse in accordance with the frequency characteristics of the input signal pulse applied to the first transducer.

5. The electroacoustic apparatus of claim 1, with the spacing between the electrode elements of each array of the first transducer having a predetermined variation in relation to the respective frequencies of the input signal within said bandwidth to steer the beam of acoustic wave energy generated by the first transducer in relation to said axis to a desired location on the second transducer.

6. The electroacoustic apparatus of claim 1, with the second transducer having a beam intercept center positioned in relation to said axis and including a plurality of electrode elements arranged in a plurality of arrays of interleaved interdigital grids of electrode elements, and with the spacing of the electrode elements of both the first transducer and the second transducer having substantially the same predetermined relationship to said known bandwidth of frequencies.

* * * * *